United States Patent
Ohta et al.

(10) Patent No.: US 7,247,420 B2
(45) Date of Patent: Jul. 24, 2007

(54) TWO-LAYER FILM AND METHOD OF FORMING PATTERN WITH THE SAME

(75) Inventors: Masaru Ohta, Tokyo (JP); Atsushi Ito, Tokyo (JP); Isamu Mochizuki, Tokyo (JP); Katsumi Inomata, Tokyo (JP); Shin-ichiro Iwanaga, Tokyo (JP)

(73) Assignee: JSR Corporation, Tokyo (JP)

( * ) Notice: Subject to any disclaimer, the term of this patent is extended or adjusted under 35 U.S.C. 154(b) by 216 days.

(21) Appl. No.: 10/475,096

(22) PCT Filed: Nov. 15, 2002

(86) PCT No.: PCT/JP02/11936

§ 371 (c)(1),
(2), (4) Date: Oct. 27, 2003

(87) PCT Pub. No.: WO03/065124

PCT Pub. Date: Aug. 7, 2003

(65) Prior Publication Data
US 2004/0131963 A1    Jul. 8, 2004

(30) Foreign Application Priority Data
Jan. 25, 2002  (JP) .............................. 2002-017311

(51) Int. Cl.
*G03C 5/00* (2006.01)
(52) U.S. Cl. ..................... 430/322; 430/141; 430/269
(58) Field of Classification Search ..................... None
See application file for complete search history.

(56) References Cited
U.S. PATENT DOCUMENTS

| | | | |
|---|---|---|---|
| 4,180,604 A | | 12/1979 | Feng et al. |
| 4,571,374 A | | 2/1986 | Vikesland |
| 4,596,759 A | * | 6/1986 | Schupp et al. ........... 430/271.1 |
| 5,942,369 A | * | 8/1999 | Ota et al. .................... 430/192 |
| 5,986,851 A | * | 11/1999 | Angelo et al. ............. 360/235.2 |
| 6,395,449 B1 | * | 5/2002 | Hurditch et al. ......... 430/270.1 |
| 2001/0035343 A1 | | 11/2001 | Kamijima |
| 2004/0192804 A1 | * | 9/2004 | Kura et al. .................... 522/65 |

FOREIGN PATENT DOCUMENTS

JP   7-98500   4/1995

* cited by examiner

*Primary Examiner*—John A. McPherson
*Assistant Examiner*—Daborah Chacko-Davis
(74) *Attorney, Agent, or Firm*—Oblon, Spivak, McClelland, Maier & Neustadt, P.C.

(57) ABSTRACT

The invention concerns a lift-off process for patterning layers that are deposited and/or sputtered. The invention provides a two-layer resist and a patterning method using the resist. The patterning method can readily produce burr-free layers on a substrate.

The method comprises the steps of:
- sequentially applying positive radiation-sensitive resin compositions 1 and 2 to form a two-layer laminate;
- subjecting the two-layer resist to single exposure and development to produce fine patterns having an under-cut cross section;
- depositing and/or sputtering an organic or inorganic thin layer with use of the resist pattern as a mask; and
- lifting off the resist pattern to leave a pattern of the thin layer in desired shape.

30 Claims, 3 Drawing Sheets

(a)

(b)

(c)

(d)

(a)

(b)

(c)

(d)

TWO-LAYER FILM AND METHOD OF FORMING PATTERN WITH THE SAME

FIELD OF THE INVENTION

The present invention relates to photofabrication, in other words precision microfabrication by photolithography technique. More particularly, the invention relates to a lift-off process using a two-layer resist.

BACKGROUND OF THE INVENTION

Lift-off is a general term for a process of forming a pattern of organic or inorganic thin layers by:

applying a resist onto a workpiece surface;

patterning the resist layer by a photolithography technique;

depositing and/or sputtering an organic or inorganic substance over the resist layer and areas in which the resist has been cleared; and releasing the resist layer together with the overlying organic or inorganic thin layer.

As a consequence, the organic or inorganic substance found in the orifices of the resist layer remains there to form a desired pattern.

In this lift-off process, the resist pattern profile is very important. For example, positive resists will typically produce a pattern which tapers forward as shown in FIG. 2(c). Releasing of this forward tapered resist will result in a pattern of layers having burrs on their edges as shown in FIG. 2(d).

A specific example will be given with respect to the processing of MR magnetic head sliders. Here, the aforesaid lift-off process is used to form a DLC (diamond like carbon) layer on an ABS (air bearing surface) for the purpose of pad protection. As described above, the lift-off process can produce burrs on the edges of DLC layers. The burrs on the DLC layers can scratch the magnetic recording disks of HDD (hard disk drive) or can be a foreign object to cause HDD failures.

With such problems, it will be effective to use negative resists or image reversal resists which can be formed into a reverse tapered pattern. As shown in FIG. 3(c), the orifices of this reverse tapered layer have a larger size in the bottom than in the top, so that the formation of burrs can be prevented.

However, this method in general has a difficult control of the resist pattern profile. Further, it is difficult to observe the resist pattern with a light microscope and also to release the resist layer which has been hardened.

In respect to the workpiece surface as a substrate, it will usually have irregularities, which are relatively large for the thickness of applied resist, as a result of the process steps the workpiece has undergone. Because of this, it has been difficult to form a resist layer in uniform thickness.

In the above processing of MR magnetic heads, a number of strip pieces called row bars are processed as being stuck on a jog with their ABS upward. Since these row bars have a gap between the neighboring ones, a direct application of a liquid resist is impossible; therefore, a resist film such as a dry film is generally employed instead.

From the viewpoint of improving the productivity of workpieces, there has been a need for a technology which can be incorporated into the production process without disrupting the flow of process steps and by which a pattern can be readily formed on a workpiece surface.

The present inventors studied earnestly in view of the aforesaid circumstances. As a result, they have developed a two-layer laminate that comprises a resist layer (I) formed from a specific positive radiation-sensitive resin composition 1 and a resist layer (II) formed from a specific positive radiation-sensitive resin composition 2. This two-layer laminate can be formed into an undercut resist pattern by single photoexposure and development. Thus, the patterning method using the two-layer laminate can produce a burr-free layer with ease. The present invention has been completed based on these findings.

It is an object of the invention to provide a resist layer which can leave a burr-free layer on a substrate with ease, and a patterning method using the same.

SUMMARY OF THE INVENTION

The two-layer laminate according to the invention comprises:

a resist layer (I) formed from a positive radiation-sensitive resin composition 1 which comprises a radical polymer containing a hydroxyl group and/or a carboxyl group (A), a quinonediazido group-containing compound (B) and a solvent (C); and a resist layer (II) formed from a positive radiation-sensitive resin composition 2 which comprises a polymer containing a phenolic hydroxyl group (D), a quinonediazido group-containing compound (E) and a solvent (F).

The patterning method according to the invention comprises a step of forming a two-layer laminate comprising:

a resist layer (I) formed from a positive radiation-sensitive resin composition 1 which comprises a radical polymer containing a hydroxyl group and/or a carboxyl group (A), a quinonediazido group-containing compound (B) and a solvent (C); and a resist layer (II) formed from a positive radiation-sensitive resin composition 2 which comprises a polymer containing a phenolic hydroxyl group (D), a quinonediazido group-containing compound (E) and a solvent (F)

The patterning method preferably comprises the steps of:

(a) forming on a substrate a resist layer (I) from the positive radiation-sensitive resin composition 1 and forming on the resist layer (I) a resist layer (II) from the positive radiation-sensitive resin composition 2 to produce a two-layer laminate;

(b) forming a latent pattern in the laminate by UV light exposure and/or electron beam lithography;

(c) developing the laminate to form an undercut resist pattern in which the orifices have a larger size in the bottom than in the top;

(d) depositing and/or sputtering an organic or inorganic thin layer on the resist pattern laminate and on the exposed substrate; and (e) releasing the laminate together with the overlying thin layer deposited and/or sputtered on the laminate.

In the positive radiation-sensitive resin composition 1, the radical polymer (A) is preferably insoluble in water, soluble in an alkaline aqueous solution and insoluble or hardly soluble in the solvent (F).

In the positive radiation-sensitive resin composition 2, the solvent (F) is preferably 2-heptanone.

Preferably, the resist layer (I) has a thickness of 0.1 to 3 µm and the resist layer (II) has a thickness of 1 to 20 µm.

In the above patterning method, the substrate in the step (a) is preferably an ABS (air bearing surface) of magnetic head slider and the organic thin layer in the step (d) is preferably a DLC (diamond like carbon) layer.

BEST MODE FOR CARRYING OUT THE INVENTION

Figure 1:
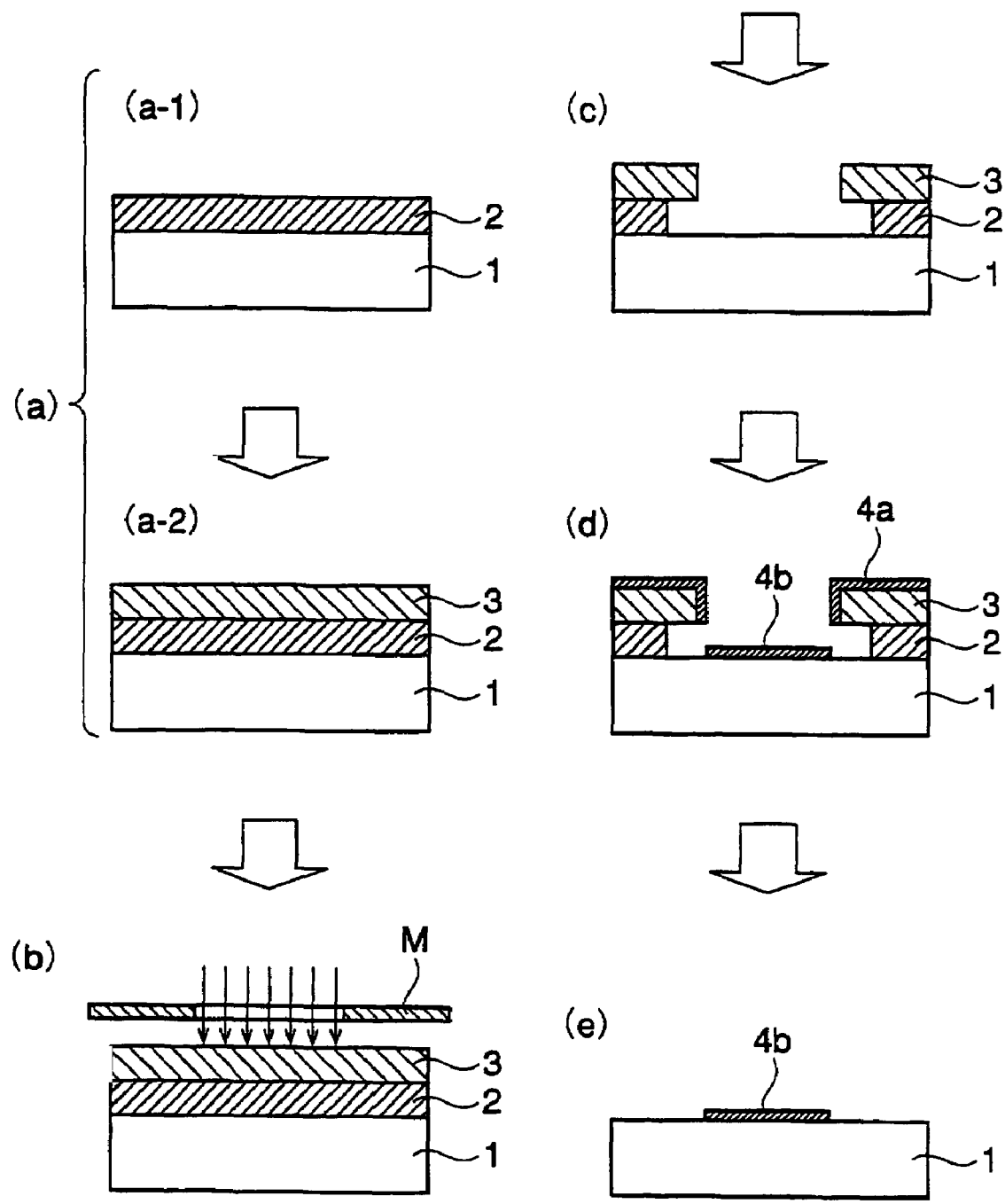
FIG. 1 is a set of schematic views of the patterning method according to the invention.
Figure 2:
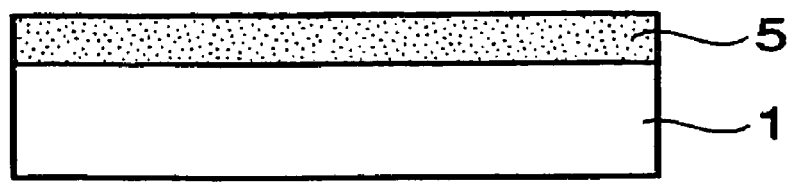
FIG. 2 is a set of schematic views of a conventional patterning method.
Figure 2:
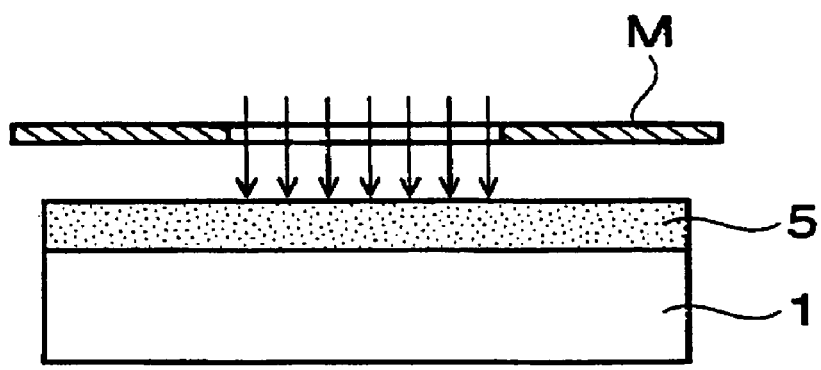
Figure 2:
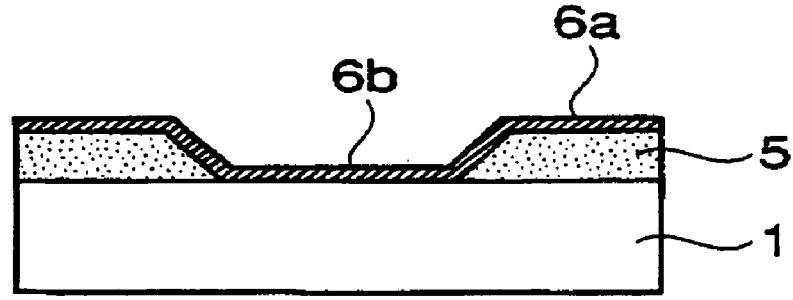
Figure 2:
Figure 3:
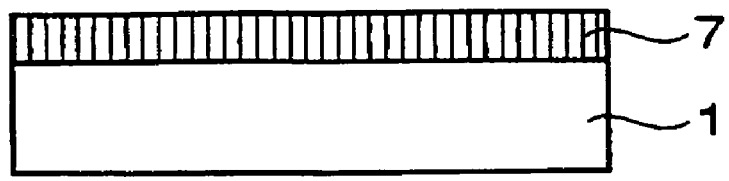
FIG. 3 is a set of schematic views of another conventional method.
Figure 3:
Figure 3:
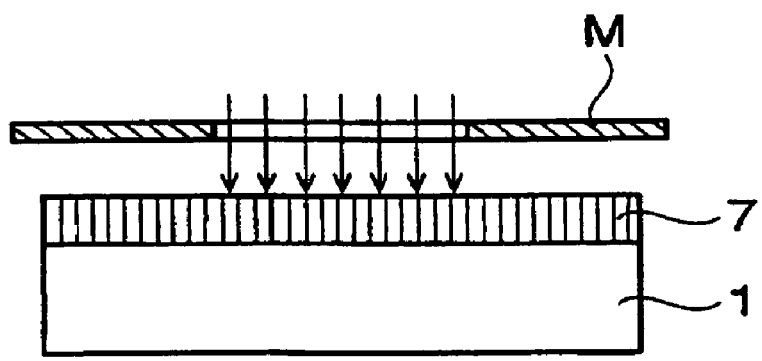
Figure 3:
Figure 3:
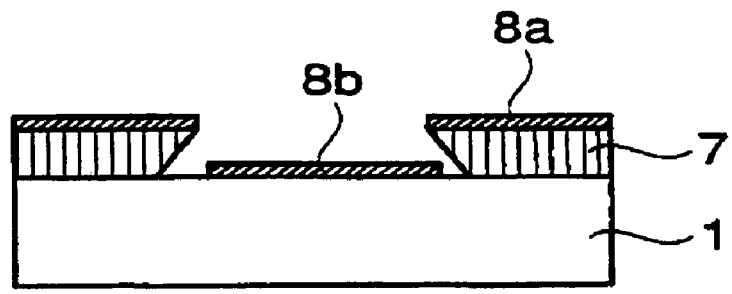
Figure 3:
Figure 3:
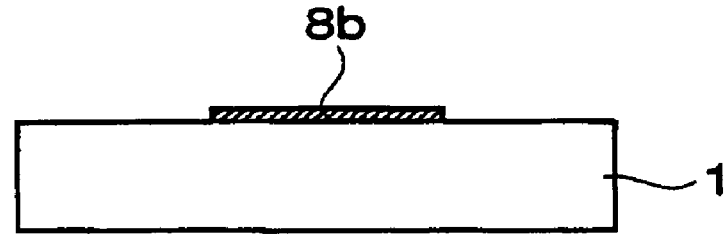

The two-layer laminate according to the invention comprises:

a resist layer (I) formed from a positive radiation-sensitive resin composition 1 which comprises a radical polymer containing a hydroxyl group and/or a carboxyl group (A), a quinonediazido group-containing compound (B) and a solvent (C); and a resist layer (II) formed from a positive radiation-sensitive resin composition 2 which comprises a polymer containing a phenolic hydroxyl group (D) a quinonediazido group-containing compound (E) and a solvent (F)

First, these resin compositions 1 and 2 will be described in detail.

<Positive Radiation-Sensitive Resin Composition 1 (Composition 1) for Lower Layer Production>

The positive radiation-sensitive resin composition 1 (hereinafter the "composition 1") desirably comprises:

(A) a radical polymer containing a hydroxyl group and/or a carboxyl group;

(B) a quinonediazido group-containing compound, (C) a solvent; and optionally (G) another component.

(A) Radical Polymer Containing a Hydroxyl Group and/or a Carboxyl Group

The radical polymer containing a hydroxyl group and/or a carboxyl group (hereinafter the "polymer (A)") comprises repeating units that result from the cleavage of carbon-carbon double bonds among:

a radically polymerizable compound having a hydroxyl group (monomer I); and/or a radically polymerizable compound having a carboxyl group (monomer II); and another radically polymerizable compound (monomer III).

(Monomer I)

There are broadly two types of the radically polymerizable compounds having a hydroxyl group (monomer I): monomers with an alcoholic hydroxyl group and monomers with a phenolic hydroxyl group.

Examples of the monomers with an alcoholic hydroxyl group include hydroxyalkyl esters, such as 2-hydroxyethyl acrylate, 2-hydroxyethyl methacrylate and 2-hydroxypropyl methacrylate; and vinyl esters of fatty acids that will produce an alcoholic hydroxyl group upon hydrolysis after polymerization, such as vinyl formate, vinyl acetate and vinyl propionate. These compounds may be used either individually or in combination of two or more kinds. Of the compounds, the hydroxyalkyl esters are preferable, and 2-hydroxyethyl methacrylate and 2-hydroxyethyl acrylate are more preferable.

Examples of the monomers with a phenolic hydroxyl group include p-hydroxystyrene, m-hydroxystyrene, o-hydroxystyrene, α-methyl-p-hydroxystyrene, α-methyl-m-hydroxystyrene, α-methyl-o-hydroxystyrene, 4-isopropenylphenol, 2-allylphenol, 4-allylphenol, 2-allyl-6-methylphenol, 2-allyl-6-methoxyphenol, 4-allyl-2-methoxyphenol, 4-allyl-2,6-dimethoxyphenol and 4-allyloxy-2-hydroxybenzophenone. These compounds may be used either individually or in combination of two or more kinds. Of the compounds, p-hydroxystyrene and 4-isopropenylphenol are preferred.

(Monomer II)

The radically polymerizable compound having a carboxyl group (monomer II) may be exemplified with:

monocarboxylic acids, such as acrylic, methacrylic and crotonic acids;

dicarboxylic acids, such as maleic, fumaric, citraconic, mesaconic and itaconic acids; and (meth)acrylic acid derivatives with a carboxyl group, such as 2-methacryl oxy ethyl maleic acid, 2-methacryl oxy ethyl succinic acid and 2-hexahydrophthaloylethyl methacrylate.

These compounds may be used either individually or in combination of two or more kinds. Of the compounds, acrylic acid, methacrylic acid and 2-hexahydrophthaloylethyl methacrylate are preferred.

(Monomer III)

The another radically polymerizable compound (monomer III) is used for the main purpose of appropriately controlling mechanical properties of the polymer; in other words, for controlling the glass transition temperature of the polymer. The "another" refers that it is of a different kind from the monomers I and II.

The monomer III may be exemplified with alkyl (meth) acrylates, aryl (meth)acrylates, dicarboxylic acid diesters, aromatic vinyls, conjugated diolefins, nitrile group-containing polymerizable compounds, chlorine-containing polymerizable compounds, polymerizable compounds having amide linkages, and vinyl esters of fatty acids. Specific examples include:

alkyl (meth)acrylates, such as methyl methacrylate, ethyl methacrylate, n-butyl (meth)acrylate, sec-butyl (meth)acrylate, t-butyl (meth)acrylate and isopropyl (meth)acrylate;

aryl (meth)acrylates, such as phenyl (meth)acrylate and benzyl (meth)acrylate;

dicarboxylic acid diesters, such as diethyl maleate, diethyl fumarate and diethyl itaconate;

aromatic vinyls, such as styrene, α-methylstyrene, m-methylstyrene, p-methylstyrene, vinyltoluene and p-methoxystyrene;

conjugated diolefins, such as 1,3-butadiene, isoprene and 1,4-dimethylbutadiene;

nitrile group-containing polymerizable compounds, such as acrylonitrile and methacrylonitrile;

chlorine-containing polymerizable compounds, such as vinyl chloride and vinylidene chloride;

polymerizable compounds having amide linkages, such as acrylamide and methacrylamide; and vinyl esters of fatty acids, such as vinyl acetate.

These compounds may be used either individually or in combination of two or more kinds. Of the compounds, the alkyl acrylates, particularly n-butyl acrylate, can be suitably used.

The radical copolymerization of both or either the monomer I and/or the monomer II, and the monomer III produces the polymer (A) for use in the invention. Preferably, all the monomers I to III will be radically copolymerized to give the polymer.

When the polymer (A) has been obtained by the radical polymerization of the monomers I, II and III, the polymer (A) desirably has the proportions of structural units derived from the monomers I to III (hereinafter the monomer I (II or III) unit content) of:

the monomer I unit content of preferably 19 to 90 wt %, and more preferably 40 to 80 wt %;

the monomer II unit content of preferably 1 to 30 wt %, and more preferably 2 to 20 wt %; and the monomer III unit content of preferably 9 to 80 wt %, and more preferably 18 to 50 wt %.

Further, when the polymer (A) has been obtained by the radical polymerization of either the monomer I or the monomer II and the monomer III, the polymer (A) desirably has:

the monomer I or II unit content of preferably 10 to 90 wt %, and more preferably 20 to 60 wt %; and the monomer III unit content of preferably 10 to 90 wt %, and more preferably 40 to 80 wt %.

The synthesis of the polymer (A) may be carried out in a polymerization solvent. Examples of the solvent include:

alcohols, such as methanol, ethanol, ethylene glycol, diethylene glycol and propylene glycol;

cyclic ethers, such as tetrahydrofuran and dioxane;

alkyl ethers of polyvalent alcohols, such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycol monoethyl ether;

alkyl ether acetates of polyvalent alcohols, such as ethylene glycol ethyl ether acetate, diethylene glycol ethyl ether acetate and propylene glycol ethyl ether acetate;

aromatic hydrocarbons, such as toluene and xylene;

ketones, such as acetone, methyl ethyl ketone, methyl isobutyl ketone, cyclohexanone, 4-hydroxy-4-methyl-2-pentanone and diacetone alcohol; and esters, such as ethyl acetate, butyl acetate, ethyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate and butyl acetate. Of these compounds, the cyclic ethers, alkyl ethers of polyvalent alcohols, alkyl ether acetates of polyvalent alcohols, ketones and esters are preferred.

The catalyst used in the above radical polymerization may be a conventional radical polymerization initiator. Examples of such polymerization catalysts include:

azo compounds, such as 2,2'-azobisisobutyronitrile, 2,2'-azobis-(2,4-dimethylvaleronitrile) and 2,2'-azobis-(4-methoxy-2,4-dimethylvaleronitrile);

organic peroxides, such as benzoyl peroxide, lauroyl peroxide, t-butyl peroxypivalate and 1,1'-bis-(t-butylperoxy)cyclohexane; and hydrogen peroxide. The peroxides may be used in the radical polymerization as a redox initiator in combination with a reducing agent.

In view of developability and adhesive properties of the resist layer (I) formed from the composition 1, the polymer (A) preferably has a weight-average molecular weight of 2,000 to 100,000, and more preferably 5,000 to 50,000. The weight-average molecular weight less than 2,000 will cause the development to proceed too quickly; whereas that exceeding 100,000 will result in too long a development time. In any cases, the resolution will be remarkably deteriorated. In the present specification, all the weight-average molecular weights are the values in terms of polystyrene according to GPC.

In order to obtain good developability and to form a desirable undercut resist pattern, the polymer (A) preferably is insoluble in water but is soluble in an alkaline aqueous solution. Since the resist layer (I) is laminated with the resist layer (II), the polymer (A) is preferably insoluble or hardly soluble in a solvent (F) so that these layers will not mix with each other. The solvent (F) will be described later.

The polymer (A) being insoluble in water means that it has substantially no solubility in water. Hence, the polymer may dissolve in an amount of 0.1 g or less when it is in 100 g of water at 25° C.

The polymer (A) being soluble in an alkaline aqueous solution means that the alkali development may be suitably carried out. Specifically, an alkaline aqueous solution, for example 100 g of an aqueous solution of 2.38 wt % of tetramethylammonium hydroxide having a temperature of 25° C., will dissolve the polymer (A) in an amount of preferably 5 g or more. The alkali to make the alkaline aqueous solution is not particularly limited. Exemplary alkalis will be listed later with respect to the preparation of alkaline developer.

Since the polymer (A) has no or little solubility in the solvent (F), it will not substantially dissolve or will dissolve very slightly in the solvent. Specifically, the polymer (A) may dissolve in an amount of not more than 0.1 g in the solvent (F), for example 100 g of 2-heptanone at 25° C.

(B) Quinonediazido Group-Containing Compound

The quinonediazido group-containing compound works as a photosensitizer. It is used for the purpose that the development of the two-layer resist film will proceed properly to allow for a margin time for controlling the depth of recessed space W in the undercut. The recessed space W of the undercut indicates an area in the bottom orifice in the lower layer 2 that does not overlap with the top orifice in the upper layer 3 (see FIG. 1(*d*)).

Exemplary quinonediazido group-containing compounds include esters, partial esters, amides and partial amides formed between:

either a quinonediazido group-containing sulfonic acid (e.g. naphthoquinone-1,2-diazido-5-sulfonic acid, naphthoquinone-1,2-diazido-4-sulfonic acid or orthoanthraquinonediazide sulfonic acid) or naphthoquinone-1,2-diazido-5-sulfonyl chloride with any of:

polyhydroxybenzophenones, such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone and 2,3,3',4,4',5'-hexahydroxybenzophenone;

bis[(poly)hydroxyphenyl]alkanes, such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane and 2-(2,3,4-trihydroxyphenyl)-2-(2',3',4'-trihydroxyphenyl)propane;

tris(hydroxyphenyl)methanes or substitution products of methyl substitution thereof, such as tris(4-hydroxyphenyl)methane, bis(4-hydroxy-3,5-dimethylphenyl)-4-hydroxyphenyl methane, bis(4-hydroxy-2,5-dimethylphenyl)-4-hydroxyphenyl methane, bis(4-hydroxy-3,5-dimethylphenyl)-2-hydroxyphenyl methane, bis(4-hydroxy-2,5-dimethylphenyl)-2-hydroxyphenyl methane, bis(4-hydroxy-2,5-dimethylphenyl)-3,4-dihydroxyphenyl methane and bis (4-hydroxy-3,5-dimethylphenyl)-3,4-dihydroxyphenyl methane;

bis (cyclohexyl hydroxyphenyl)hydroxyphenyl methanes or substitution products of methyl substitution thereof, such as bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(5-cyclohexyl-4-hydroxy-2-methylphenyl)-2-hydroxyphenyl methane, bis(5-cyclohexyl-4-hydroxy-2-methylphenyl)-3-hydroxyphenyl methane, bis(5-cyclohexyl-4-hydroxy-2-methylphenyl)-4-hydroxyphenyl methane, bis(3-cyclohexyl-2-hydroxyphenyl)-3-hydroxyphenyl methane, bis(5-cyclohexyl-4-hydroxy-3-methylphenyl)-4-hydroxyphenyl methane, bis(5-cyclohexyl-4-hydroxy-3-methylphenyl)-3-hydroxyphenyl methane, bis(5-cyclohexyl-4-hydroxy-3-methylphenyl)-2-hydroxyphenyl methane, bis(3-cyclohexyl-2-hydroxyphenyl)-4-hydroxyphenyl methane, bis(3-cyclohexyl-2-hydroxyphenyl)-2-hydroxyphenyl methane, bis(5-cyclohexyl-2-hydroxy-4-methylphenyl)-2-hydroxyphenyl methane and bis(5-cyclohexyl-2-hydroxy-4-methylphenyl)-4-hydroxyphenyl methane;

4,4'-[1-[4-[1-(4-hydroxyphenyl)-1-methylethyl] phenyl] ethylidene]diphenol;

7-hydroxy-4-(4'-hydroxyphenyl)-2-methyl-2-(2',4'-dihydroxy)phenylcoumarone;

novolak resins, pyrogallol/acetone resins and homopolymer of p-hydroxystyrene or copolymer thereof with a copolymerizable monomer; and compounds containing a hydroxyl or amino group, such as phenol, p-methoxyphenol, dimethylphenol, hydroquinone, naphthol, pyrocatechol, pyrogallol, pyrogallol monomethylether, pyrogallol-1,3-dimethylether, gallic acid, aniline, p-aminodiphenylamine and 4,4'-diaminobenzophenone.

The resin composition 1 for lower layer production contains at least one of the above quinonediazido group-containing compounds.

Of the above reaction products, an ester formed between 1 mol of 4,4'-[1-[4-[1-(4-hydroxyphenyl)-1-methylethyl] phenyl]ethylidene]diphenol and 1.0 mol of naphthoquinone-1,2-diazido-5-sulfonyl chloride, is preferred.

Desirably, the quinonediazido group-containing compound (B) will be used in an amount of 5 to 60 parts by weight, preferably 10 to 50 parts by weight, and more preferably 15 to 30 parts by weight based on 100 parts by weight of the radical polymer (A). When the amount is less than 5 parts by weight, the dissolution rate toward the alkali developer will hardly differ between exposed and non-exposed areas. On the other hand, the amount exceeding 60 parts by weight may result in lowered adhesive properties of the resultant resist layer (I) to the substrate.

(C) Solvent

The solvent (C) used in the composition 1 may be exemplified with ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol monomethyl ether acetate, propylene glycol monopropyl ether acetate, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-ethoxypropionate, ethyl 3-methoxypropionate, butyl acetate, methylpyruvate, ethyl pyruvate and so forth. The above solvent may be used with a high boiling solvent, such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate or ethylene glycol monophenyl ether acetate. These solvents may be used either individually or in combination of two or more kinds. Of the solvents, ethyl 2-hydroxypropionate is preferred.

Since the composition 1 will be spin coated to a thickness of 5 µm or less, the solvent is desirably added to make the composition 1 have a solids content of 5 to 50 wt %, and more preferably 10 to 25 wt %. That is, the solvent is desirably used in an amount of 100 to 1900 parts by weight, and preferably 300 to 900 parts by weight based on 100 parts by weight of the components (A) and (B).

(G) Another Component

The composition 1 may contain another additive. For example, a surfactant may be added to improve application, defoaming and leveling properties of the composition. Suitable surfactants include:

fluorine-based surfactants, such as commercial products BM-1000 and BM-1100 (BM Chemie); MEGAFACE series F142D, F172, F173 and F183 (Dainippon Ink and Chemicals, Incorporated); FLUORAD series FC-135, FC-170C, FC-430 and FC-431 (Sumitomo 3M); SURFLON series S-112, S-113, S-131, S-141 and S-145 (Asahi Glass Co., Ltd.); SH-28PA, SH-190, SH-193, SZ-6032 and SF-8428 (Toray Silicone); and NBX-15 (Neos Co., Ltd.); and nonionic surfactants, such as commercial products Nonion S-6, Nonion 0-4, Pronon 201 and Pronon 204 (NOF Corporation); and EMULGEN series A-60, A-90 and A-500 (Kao Corporation). These may be used either individually or in combination of two or more kinds.

Preferably, the surfactant (s) will be used in an amount of not more than 5 parts by weight, and more preferably from 0.01 to 2 parts by weight based on 100 parts by weight of the radical polymer (A).

<Positive Radiation-Sensitive Resin Composition 2 (Composition 2) for Upper Layer Production>

The positive radiation-sensitive resin composition 2 (hereinafter the "composition 2") for upper layer production desirably comprises:

(D) a polymer containing a phenolic hydroxyl group;

(E) a quinonediazido group-containing compound;

(F) a solvent; and optionally (H) another component.

The another component is preferably a radical polymer with a hydroxyl and/or carboxyl group or an additive such as a surfactant.

(D) Polymer Containing a Phenolic Hydroxyl Group

The polymer containing a phenolic hydroxyl group may be exemplified with the following novolak resins, polyhydroxystyrenes and derivatives thereof. These may be used either individually or in combination.

(Novolak Resin)

The novolak resin used in the invention has an alkali solubility and is obtained as a condensation product of m-cresol, one or more other phenols and an aldehyde compound. The alkali soluble novolak resin is not particularly limited, provided that the m-cresol has a proportion of 40 to 90 mol % of all the phenols.

The one or more other phenols used in the production of novolak resins may be selected from, for example, 2,3-xylenol, 2,4-xylenol, 2,5-xylenol, 3,4-xylenol, 3,5-xylenol and 2,3,5-trimethylphenol. These may be used either individually or in combination.

Of the above phenols, 2,3-xylenol, 2,4-xylenol, 3,4-xylenol and 2,3,5-trimethylphenol are preferable.

Preferred examples of m-cresol/phenol(s) combinations include m-cresol/2,3-xylenol, m-cresol/2,4-xylenol, m-cresol/2,3-xylenol/3,4-xylenol, m-cresol/2,3,5-trimethylphenol and m-cresol/2,3-xylenol/2,3,5-trimethylphenol.

Suitable aldehyde compounds for the condensation include formaldehyde, paraformaldehyde, acetaldehyde, benzaldehyde, o-hydroxybenzaldehyde, m-hydroxybenzaldehyde, p-hydroxybenzaldehyde, glyoxal, glutaraldehyde, terephthalaldehyde and isophthalaldehyde. Of these, formaldehyde and o-hydroxybenzaldehyde are particularly suitable for use.

These aldehyde compounds may be used either individually or in combination or two or more kinds. Preferably, the aldehyde compound(s) will be used in an amount of 0.4 to 2 mol, and more preferably 0.6 to 1.5 mol based on 1 mol of the phenols.

The condensation between the phenols and the aldehyde compound is usually carried out in the presence of an acid catalyst. Exemplary acid catalysts include hydrochloric acid, nitric acid, sulfuric acid, formic acid, oxalic acid, acetic acid, methanesulfonic acid and p-toluenesulfonic acid. Generally, the acid catalyst may be used in an amount of $1 \times 10^{-5}$ to $5 \times 10^{-1}$ mol based on 1 mol of the phenols.

The condensation will be usually conducted in water as reaction medium. When it is expected that a heterogeneous system should be caused from an early stage of the reaction, the water as the reaction medium may be replaced by:

an alcohol, such as methanol, ethanol, propanol, butanol or propylene glycol monomethyl ether;

a cyclic ether, such as tetrahydrofuran or dioxane; or a ketone, such as ethyl methyl ketone, methyl isobutyl ketone or 2-heptanone.

The reaction medium may be used in an amount of 20 to 1,000 parts by weight based on 100 parts by weight of the reactants.

Although the condensation temperature may be appropriately controlled depending on the reactivity of the reactants, it is generally in the range of 10 to 200° C.

The condensation reaction may be carried out in an appropriate manner; for example either:

the phenols, the aldehyde compound, the acid catalyst, etc. are introduced into a reactor all at once; or the phenols, the aldehyde compound, etc. are added sequentially with progress of the reaction in the presence of the acid catalyst.

After completion of the condensation, the objective novolak resin will be obtained by separating it from the unreacted reactants, the acid catalyst, the reaction medium, etc. remaining in the system. For example, this separation can be made through a process in which:

the temperature in the reaction system is increased to 130 to 230° C. and the volatile components are evaporated under reduced pressure to recover the objective novolak resin; or the reaction product is mixed with a good solvent for the novolak resin to dissolve the same; and the resultant solution is mixed with a poor solvent for the novolak resin (such as water, n-hexane or n-heptane); and the precipitated phase of resin solution is segregated to recover the objective high molecular weight novolak resin.

The above good solvents include ethylene glycol monomethyl ether acetate, methyl 3-methoxypropionate, ethyl lactate, methyl isobutyl ketone, 2-heptanone, dioxane, methanol and ethyl acetate.

The novolak resin preferably has a weight-average molecular weight in terms of polystyrene (hereinafter the "Mw") of 2,000 to 20,000, and particularly preferably from 3,000 to 15,000; these ranges are preferable in view of good workability of the composition 2, and also developability, sensitivity and heat resistance of the resulting resist layer.

(Polyhydroxystyrene)

Suitable polyhydroxystyrenes include those commercially available resins: MARUKA LYNCUR M, MARUKA LYNCUR CMM, MARUKA LYNCUR CHM, MARUKA LYNCUR MB, MARUKA LYNCUR PHM-C, MARUKA LYNCUR CST and MARUKA LYNCUR CBA (Maruzen Petrochemical Co., Ltd.)

(E) Quinonediazido Group-Containing Compound

The quinonediazido group-containing compound (E) may be selected from the quinonediazido group-containing compounds (B) listed with respect to the composition 1.

Here, preferred reaction products as the quinonediazido group-containing compounds (E) include an ester formed between 1 mol of 4,4'-[1-[4-[1-(4-hydroxyphenyl)-1-methylethyl]phenyl]ethylidene]diphenol and 2.0 mol of naphthoquinone-1,2-diazido-5-sulfonyl chloride; and an ester formed between 1 mol of 7-hydroxy-4-(4'-hydroxyphenyl)-2-methyl-2-(2',4'-dihydroxy)phenylcoumarone and 2.0 mol of naphthoquinone-1,2-diazido-5-sulfonyl chloride.

The composition 2 for upper layer production contains at least one of the quinonediazido group-containing compounds.

Desirably, the quinonediazido group-containing compound (E) will be used in an amount of 5 to 60 parts by weight, preferably 10 to 50 parts by weight, and more preferably 15 to 35 parts by weight based on 100 parts by weight of the polymer (D). When the amount is less than 5 parts by weight, the dissolution rate toward the alkali developer will hardly differ between exposed and non-exposed areas. On the other hand, the amount exceeding 60 parts by weight may result in a less homogeneous resist layer (II). Thus, the resolution tends to worsen in any case.

(F) Solvent

Here, the solvent may be selected from the solvents (C) listed with respect to the composition 1, and further from 2-heptanone, 3-heptanone, 4-heptanone and cyclohexanone.

Since the resist layer (I) is laminated with the resist layer (II), the solvent (F) preferably does not or hardly dissolve the polymer (A) so that these layers will not mix with each other. In view of that, 2-heptanone, 3-heptanone, 4-heptanone and cyclohexanone are preferable for use.

Taking into the account the fact that the composition 2 will be spin coated to a thickness of 5 µm or less, the solvent is desirably added to make the composition 2 have a solids content of preferably 5 to 50 wt %, and more preferably 10 to 40 wt %. That is, the solvent is desirably used in an amount of 100 to 1900 parts by weight, and preferably 150 to 900 parts by weight based on 100 parts by weight of the components (D) and (E).

(H) Another Component

The composition 2 may contain another component. Examples are:

(Radical Polymer Containing a Hydroxyl Group and/or a Carboxyl Group)

Although this polymer is not an essential component for the composition 2, the use thereof leads to enhancements in application properties and crack resistance. This polymer may be the same as the polymer (A) used in the composition 1, in which case it is needless to say that the solvent (F) should be used that can dissolve the polymer (A).

In the composition 2, the polymer (A) (as the component (H)) maybe used in an amount of not more than 50 parts by weight, and preferably not more than 30 parts by weight based on 100 parts by weight of the polymer (D) with a phenolic hydroxyl group.

(Polynuclear Phenolic Compound)

Although this compound is not an essential component for the composition 2, the addition thereof improves alkali solubility and thereby eases control of the resist pattern profile. The polynuclear phenolic compound may be defined as a compound with two or more independent benzene rings in the molecule, at least two of which benzene rings form phenolic hydroxyl groups as a result of the linkage of a hydroxyl group somewhere in the benzene ring. Specific examples include 4,4'-[1-[4-[1-(4-hydroxyphenyl)-1-methylethyl]phenyl]ethylidene]diphenol, methyl 2,2-bis(1,5-dimethyl-4-hydroxyphenyl) propionate and 4,6-bis [1-(4-hydroxyphenyl)-1-methylethyl]-1,3-benzenediol.

Desirably, the polynuclear phenolic compound will be used in an amount of 1 to 30 parts by weight, and preferably 5 to 20 parts by weight based on 100 parts by weight of the polymer (D).

(Surfactant)

The surfactant for use herein may be selected from the surfactants listed with respect to the composition 1.

Desirably, the surfactant will be used in an amount of not more than 5 parts by weight, and preferably from 0.01 to 2 parts by weight based on 100 parts by weight of the polymer (D).

Next, the two-layer laminate and the patterning method using the laminate will be described.

<Two-layer Laminate and Patterning Method Using the Same>

The two-layer laminate according to the invention comprises a resist layer (I) formed from the aforesaid composition 1and a resist layer (II) formed from the aforesaid composition 2.

The patterning method of the invention comprises a step of forming the above two-layer laminate.

Thus, the two-layer laminate and the patterning method will be discussed together in the following description.

The patterning method will be explained with reference to FIG. 1. The method comprises:

Step (a) in which (a-1) the composition 1 is formed into a resist layer (I) (lower layer 2 in FIG. 1) on a substrate 1, and (a-2) thereon the composition 2 is formed into a resist layer (II) (upper layer 3 in FIG. 1) to prepare a two-layer laminate;

Step (b) in which the laminate is subjected to UV light exposure and/or electron beam lithography to form a latent pattern;

Step (c) in which the laminate is developed to form an undercut resist pattern in which the orifices have a larger size in the bottom than in the top;

Step (d) in which organic or inorganic thin layers 4a and 4b are formed over the resist pattern laminate and the exposed substrate by deposition and/or sputtering; and Step (e) in which the laminate, that is, the lower layer 2 and the upper layer 3 are lifted off together with the overlying thin layer 4a deposited and/or sputtered on the laminate.

In Step (a), an appropriate selection of the combination of the resin compositions 1 and 2 makes it possible to form the two-layer laminate by the method of:

(1) spin coating for the both layers; or (2) laminating for the lower layer (resist layer (I)) and spin coating for the upper layer (resist layer (II)).

That is, the resist layers (I) and (II) may be formed by a combined process of spin coating/spin coating or laminating/spin coating (lower layer/upper layer).

For example, when the workpiece surface (substrate) has relatively minor irregularities, the method (1) may be selected to simplify the process. For this reason, the former is generally employed favorably.

The latter method (2) may be favorably employed to obtain the laminate in a uniform thickness in the case where:

the workpiece surface (substrate) has relatively large irregularities to an extent where the spin coating is difficult; or the workpiece has been processed into a condition that does not allow direct application of liquid resist.

When the lower layer 2 is formed by the laminating method, it is laminated on the surface of substrate (workpiece) with heating or warming. The substrates (workpieces) have an upper limit of endurable temperature that varies from type to type. For example, heating an MR magnetic head slider as the substrate at over 100° C. is not acceptable since elements found therein may be damaged by the heat. In such cases, it will be desired to set the glass transition temperature of the lower layer 2 formed from the composition 1 rather low in order that the lower layer 2 may be laminated with heating at 100° C. or below.

The resist layer (I) (lower layer) thus obtained preferably has a thickness of 0.1 to 3 μm, and more preferably 0.3 to 2 μm in terms of control of the resist layer thickness and control of the size of the deposited and/or sputtered layer. When the lower layer has a thickness less than 0.1 μm, control of the layer thickness becomes difficult and pinholes may arise. When the lower layer thickness is over 3 μm, the deposition and/or sputtering will accompany a noticeable diffusion in the undercut area. As a consequence, difficulties may be caused in controlling the size of the pattern layer resulting from the deposition and/or sputtering.

The resist layer (II) (upper layer) preferably has a thickness of 1 to 20 μm in view of performance of patterning and resistance to heat distortion during the deposition and/or sputtering for pattern formation. When the upper layer has a thickness less than 1 μm, it will be bent due to the heat in the deposition and/or sputtering so that the sagged upper part of the undercut may touch the substrate surface. When the upper layer thickness is over 20 μm, the time for forming the pattern layer may be prolonged and difficulties may be caused in controlling the size of the pattern layer formed by the deposition and/or sputtering.

If the lower layer 2 and the upper layer 3 formed in Step (a) mix together, such a mixed layer tends to be developed to leave an undercut that has post development resides on the side of substrate. Whereas when these two layers do not mix together at all and do have an interface between them, a developer will interpenetrate along the interface. The interpenetrated developer will accelerate the development in the horizontal direction of the lower layer 2 and the control of the lateral size of the undercut becomes difficult. The mixing of the layers may be prevented by providing an interlayer of water-soluble organic substance. However, this provision increases a process step. Also, a variable thickness of the interlayer makes an appropriate development time different from place to place. Therefore, the resultant resist is liable to give orifices in variable size. Due to these reasons, the materials for the lower layer 2 and the upper layer 3 are preferably selected so that the combination will allow for appropriate intermixing between the layers.

In Step (c), the two-layer laminate is developed to form an undercut resist pattern in which the orifices have a larger size in the bottom than in the top. For successful formation of such an undercut profile, the resist layer (I) preferably has a higher dissolution rate than the resist layer (II) toward the same developer, i.e. an alkaline aqueous solution.

In subsequent Step (d), organic or inorganic thin layers 4a and 4b are formed on the resist pattern laminate and the exposed substrate by deposition and/or sputtering. This deposition and/or sputtering step (d) involves heating of the laminate surface. When the upper layer 3 is insufficient in heat resistance and/or when the recessed space W of the undercut is large, the upper periphery of the undercut will be bent due to the heat. This sagged part may give rise to burrs on the organic or inorganic thin layer 4b during the deposition and/or sputtering.

As such, the composition 2 for the production of the upper layer 3 desirably has an enough heat resistance whereby it can undergo Step (d) without any adverse results. Preferably, the lower and upper layers 2 and 3 have a developability enough to allow for a margin time for controlling the depth of recessed space W of the undercut.

As has been explained above, the recessed space W of the undercut indicates an area in the bottom orifice in the lower layer 2 that does not overlap with the top orifice in the upper layer 3 (see FIG. 1(*d*)).

The combination of the compositions 1 and 2 preferably satisfies the aforesaid conditions.

Each step of the patterning method according to the invention will be described in more detail with reference to FIG. 1.

(Step (a))

As shown in FIG. 1(*a*-1), the composition 1 is formed into the resist layer (I) (lower layer 2 in FIG. 1) on the substrate. When the substrate has a relatively flat surface, the composition 1 (solids content: 5 to 50 wt %) may be spin coated onto the substrate 1. Then the resulting coating (lower layer 2) formed on the substrate may be dried at 200° C. or below, preferably from 70 to 130° C., to produce the lower layer 2.

When the substrate 1 has irregularities on the surface, the lower layer 2 may be formed through lamination. In this case:

the composition is spin coated on a substrate, such as PET (polyethylene terephthalate), for ensuring uniformity of the resist layer (I);

the resultant coating is baked in a clean oven or the like to give a film; and the film is laminated on the substrate 1 with a laminator.

Laminating conditions may be appropriately determined based on the material for the substrate 1 and so forth.

Next, as FIGS. 1(*a*-2) illustrates, the composition 2 is formed into the resist layer (II) (upper layer) over the resist layer (I). Desirably, for example, the composition 2 will be spin coated onto the resist layer (I) (lower layer 2 in FIG. 1) and the resultant coating will be dried at 200° C. or below, preferably from 70 to 130° C., to produce the resist layer (II) (upper layer 3 in FIG. 1).

The resist layer (II) (upper layer 3 in FIG. 1) also may be formed through lamination. In this case:

the composition 2 is formed into a film on a substrate, such as PET; and the film is laminated on the resist layer (I) (lower layer 2) with a laminator.

Further, the lower and upper layers 2 and 3 may be formed on the substrate 1 by a single lamination process, in which the compositions are successively formed into the lower and upper layers on a substrate, such as PET, and the bilayer film is laminated on the substrate 1 with a laminator.

(Step (b))

Next, the laminate comprising the lower and upper layers 2 and 3 is exposed through a given mask M to radiation, thereby forming a latent pattern. Radiation sources include low-pressure, high-pressure and super-high-pressure mercury lamps, metal halide lamps and argon gas lasers. The radiation includes ultraviolet rays (UV light), visible rays, far ultraviolet rays, X rays and electron beams. Of these radiations, UV light and electron beams are preferred for their handling properties. In the above exposure for latent patterning, the radiation is preferably applied to the laminate in a dose of 100 to 1500 $mJ/cm^2$, and more preferably 300 to 1000 $mJ/cm^2$.

(Step (c))

The exposed laminate is then developed with an alkaline developer. Exemplary developing methods include dipping, paddling and showering. As a consequence, the exposed area of the laminate alone is dissolved and removed to leave a desired resist pattern as shown in FIG. 1(*c*). This resist pattern has an undercut profile which is wider in the bottom than in the top.

The developer used herein may be an alkaline aqueous solution, such as of sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,10]-7-undecene or 1,5-diazabicyclo[4,3,0]-5-nonane.

The alkaline aqueous solution may be mixed with an appropriate amount of water-soluble organic solvent, such as methanol or ethanol, or water-soluble surfactant. After the development, the substrate and the resist pattern are rinsed with water or the like and then dried.

A further step may be incorporated between the above steps; for example the following may be appropriately carried out:

a flattening step to provide a flat foundation under the lower layer 2;

a pretreatment to improve adhesion between the substrate 1 or the foundation and the lower layer 2;

formation of an interlayer between the lower and upper layers 2 and 3 to control intermixing of the layers;

wetting pretreatment for enhancing wetting properties of the laminate before development; and post-baking after the development.

The compositions 1 and 2 have a very good alkali solubility, thus so do the resist layers (I) and (II). Further, the resist layer (I) has a higher dissolution rate than the resist layer (II) toward the same developer. These features make it possible to form an undercut resist pattern with high reproducibility.

The resist pattern is easy to release. Moreover, it is possible to observe the resist pattern with a light microscope to confirm the undercut profile. These features allows for easy pattern release and re-patterning when the resist obtained does not have a desired undercut profile.

(Step (d))

As shown in FIG. 1(d), the organic or inorganic thin layers 4a and 4b are formed by deposition and/or sputtering through the undercut resist pattern obtained above. The thickness of these organic or inorganic thin layers is not particularly limited, but is preferably smaller than the thickness of the lower layer 2 in order to control the shape of the thin layers.

The deposition and/or sputtering can cause a vertical anisotropy in the resultant thin layer. Therefore, the diameter of the orifice in positive resist upper layer 3 and the thickness of the lower layer 2 should be determined carefully. This is important to form the thin layer 4b in a controlled shape. Effective deposition and/or sputtering methods include PVD (physical vapor deposition) such as vacuum deposition and sputtering.

(Step (e))

After the thin layers 4a and 4b have been formed in above Step (d), the laminate is released together with the thin layer 4a found on the laminate. As a consequence, the thin layer 4b alone remains to define an objective pattern.

The releasing of the resist together with the thin layer 4a to form the pattern 4b may be carried out using a solvent which has been conventionally used in the releasing of positive resists. Exemplary solvents include ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol monomethyl ether acetate, propylene glycol monopropyl ether acetate, acetone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-ethoxypropionate, ethyl 3-methoxypropionate, butyl acetate, methylpyruvate, ethyl pyruvate and so forth. Also usable are high boiling solvents, such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and ethylene glycol monophenyl ether acetate.

Although the releasing of the resist pattern can be made at room temperature, the releasability may be increased by raising the temperature.

Otherwise, the substrate with the resist pattern may be overall exposed to UV light before the releasing. Upon UV light exposure, the photosensitizer contained either in both the upper and lower layers or in the upper layer will decompose to make the resist pattern easily releasable. After this treatment, the releasing may be accomplished at room temperature only by dipping the substrate in the aforesaid developer or a solvent which has little corrosiveness, such as ethyl alcohol or isopropyl alcohol.

EFFECT OF THE INVENTION

According to the invention, a fine resist pattern having an undercut cross section may be formed on a substrate by single exposure and development. The lift-off process using the resist pattern can produce a desired pattern of (organic or inorganic) thin layers on the substrate.

The fine resist pattern with an undercut cross section can be obtained by single photoexposure and development, can be observed with a light microscope to confirm the undercut profile, and can be released easily. With these advantages in the production process, the use of the invention leads to enhancement in productivity of workpieces.

Having the above effects, the patterning method of the invention is suitable for the production of DLC (diamond like carbon) layers on ABS (air bearing surfaces) of magnetic heads.

EXAMPLES

The present invention will be hereinafter described in detail by the following Examples, but it should be construed that the invention is in no way limited to those Examples. Hereinafter, "parts" and "%" are by weight unless otherwise mentioned.

Preparacion Examples

Preparation of Compositions 1 and 2

The following is a description of the components (A) to (H) that were used in the preparation of compositions (1-1) to (1-7) for lower layer production and compositions (2-1) to (2-2) for upper layer production.

<Radical Polymer Containing a Hydroxyl Group and/or a Carboxyl Group (A)>

(Synthesis of Radical Polymer A-1)

A flask equipped with a dry ice/methanol reflux condenser and a thermometer was purged with nitrogen. The flask was charged with a polymerization initiator: 3.0 g of 2,2'-azobisisobutyronitrile, and a solvent: 150 g of ethyl 2-hydroxypropionate. They were stirred together until the polymerization initiator dissolved in the solvent. Subsequently, 43 g of 4-isopropenylphenol (monomer I), 30.8 g of n-butyl acrylate (monomer III), 2.9 g of acrylic acid (monomer II) and 23.3 g of 2-hydroxyethyl acrylate (monomer I) were introduced into the flask. The contents were stirred slowly to give a solution, which thereafter was heated to 70° C. Thus, polymerization was carried out at the temperature for 3 hours. The polymerization initiator 2,2'-azobisisobutyronitrile was further added in an amount of 1.5 g, and the polymerization was continued for another 3 hours at 70° C. Then, the solution was allowed to cool to room temperature. The gas in the flask was replaced with air. After addition of 150 mg of p-methoxyphenol, the solution obtained by the above reaction was added dropwise to a large quantity of methanol to solidify the reaction product. The reaction product was washed with water, redissolved in tetrahydrofuran of equal weight as the reaction product, and resolidified in a large amount of methanol. This operation through redissolution to resolidification was repeated three times. The solidified product thus obtained was vacuum dried at 40° C. for 48 hours to yield a radical polymer A-1.

(Synthesis of Radical Polymer A-2)

The above procedure for synthesizing the polymer A-1 was repeated except that:

43.43 g of 4-isopropenylphenol (monomer I),
20.75 g of n-butyl acrylate (monomer III),
2.92 g of acrylic acid (monomer II) and
32.9 g of 2-hydroxyethyl acrylate (monomer I)

were used as the monomers. Thus, a radical polymer A-2 was obtained.

(Synthesis of Radical Polymer A-3)

The above procedure for synthesizing the polymer A-1 was repeated except that:

47.2 g of 4-isopropenylphenol (monomer I),
33.80 g of n-butyl acrylate (monomer III) and
19.0 g of acrylic acid (monomer II)

were used as the monomers. Thus, a radical polymer A-3 was obtained.

(Synthesis of Radical Polymer A-4)

A flask equipped with a dry ice/methanol reflux condenser and a thermometer was purged with nitrogen. The flask was charged with a polymerization initiator: 3.0 g of 2,2'-azobisisobutyronitrile, and a solvent: 225 g of ethyl 2-hydroxypropionate. They were stirred together until the polymerization initiator dissolved in the solvent. Subsequently, 75.0 g of 2-hydroxyethyl methacrylate (monomer I), 60.0 g of n-butyl acrylate (monomer III) and 15.0 g of 2-hexahydrophthaloylethyl methacrylate (monomer II) were introduced into the flask. The contents were stirred slowly to give a solution, which thereafter was heated to 80° C. Thus, polymerization was carried out at the temperature for 4 hours. Then, the solution was allowed to cool to room temperature. The gas in the flask was replaced with air. After addition of 150 mg of p-methoxyphenol, the solution obtained by the above reaction was added dropwise to a large quantity of methanol to solidify the reaction product. The reaction product was washed with water, redissolved in tetrahydrofuran of equal weight as the reaction product, and resolidified in a large amount of methanol. This operation through redissolution to resolidification was repeated three times. The solidified product thus obtained was vacuum dried at 40° C. for 48 hours to yield a radical polymer A-4.

(Synthesis of Radical Polymer A-5)

The above procedure for synthesizing the polymer A-4 was repeated except that:

60.0 g of 4-isopropenylphenol (monomer I),
60.0 g of n-butyl acrylate (monomer III) and
30.0 g of n-butyl methacrylate (monomer III)

were used as the monomers. Thus, a radical polymer A-5 was obtained.

(Synthesis of Radical Polymer A-6)

The above procedure for synthesizing the polymer A-4 was repeated except that:

60.0 g of 2-hexahydrophthaloylethyl methacrylate (monomer II),
60.0 g of n-butyl acrylate (monomer III) and
30.0 g of n-butyl methacrylate (monomer III)

were used as the monomers. Thus, a radical polymer A-6 was obtained.

<Quinonediazido Group Containing Compounds (B) and (E)>

As the quinonediazido group-containing compound, use was made of:

B-1: an ester formed between 1 mol of 4,4'-[1-[4-[1-(4-hydroxyphenyl)-1-methylethyl]phenyl] ethylidene]diphenol and 1.0 mol of naphthoquinone-1,2-diazido-5-sulfonyl chloride E-1: an ester formed between 1 mol of 4,4'-[1-[4-[1-(4-hydroxyphenyl)-1-methylethyl]phenyl]ethylidene]diphenol and 2.0 mol of naphthoquinone-1,2-diazido-5-sulfonyl chloride E-2: an ester formed between 1 mol of 7-hydroxy-4-(4'-hydroxyphenyl)-2-methyl-2-(2',4'-dihydroxy)phenylcoumarone and 2.0 mol of naphthoquinone-1,2-diazido-5-sulfonyl chloride <Solvent (C)>

The solvent used was:
EL: ethyl 2-hydroxypropionate

<Synthesis of the Polymer (D) Containing a Phenolic Hydroxyl Group>

D-1:
m-Cresol, 2,3-xylenol and 3,4-xylenol were mixed together in a proportion of 80:10:10 (by weight). After addition of formalin, the resultant mixture was condensed by a conventional method under catalysis by oxalic acid to give a cresol novolak. The resin was then subjected to fractionation to remove low molecular weight fractions. Thus, a novolak resin D-1 with a weight-average molecular weight of 10,000 was obtained.

D-2:
m-Cresol and p-cresol were mixed together in a proportion of 40:60 (by weight). After addition of formalin, the resultant mixture was condensed by a conventional method under catalysis by oxalic acid to give a cresol novolak. The resin was then subjected to fractionation to remove low molecular weight fractions. Thus, a novolak resin D-2 with a weight-average molecular weight of 15,000 was obtained.

D-3:
m-Cresol and 3,5-xylenol were mixed together in a proportion of 80:20 (by weight). After addition of formalin, the resultant mixture was condensed by a conventional method under catalysis by oxalic acid to give a cresol novolak. The resin was then subjected to fractionation to remove low molecular weight fractions. Thus, a novolak resin D-3 with a weight-average molecular weight of 15,000 was obtained.

<Solvent (F)>

The solvent used was either:
MAK (2-heptanone) or
a mixed solvent of EL (ethyl 2-hydroxypropionate) and EEP (ethyl 3-ethoxypropionate)

<Surfactants (G) and (H)>

The surfactant used was:
NBX-15 (fluorine-based surfactant available from Neos Co., Ltd.) or
SF-8428 (available from Toray Silicone)

<Polynuclear Phenolic Compound (H)>

The polynuclear phenolic compound used was the following.

Polynuclear Phenolic Compound 1: 4,4'-[1-[4-[1-(4-hydroxyphenyl)-1-methylethyl]Phenyl]Ethylidene]Diphenol <Preparation of Compositions (1-1) to (1-7) for Lower Layer Production>

(Preparation of Composition (1-1))

A solution was made from:
100 parts of the radical polymer A-1,
20 parts of the quinonediazido group-containing compound B-1,
0.2 part of the surfactant NBX-15 (Neos Co., Ltd,) and
680 parts of EL.

The solution was filtered through a membrane filter with pores of 1 μm diameter. The composition (1-1) was thus obtained.

(Preparation of Compositions (1-2) to (1-7))

These compositions were prepared from the components given in Table 1 in the same manner as for the composition (1-1)

<Preparation of compositions (2-1) to (2-2) for upper layer production>

(Preparation of Composition (2-1))

A uniform solution was prepared from:
90 parts of the polymer D-1,
10 parts of the polynuclear phenolic compound 1,
20 parts and 10 parts of the quinonediazido group-containing compounds E-1 and E-2 respectively,
0.2 part of the surfactant NBX-15 and
180 parts of MAK.

The solution was filtered through a membrane filter with pores of 3 μm diameter. Thus, the composition (2-1) was obtained in 35% solids content.

(Preparation of Composition (2-2))

A solution was prepared from:
25 parts of the polymer D-2,
75 parts of the polymer D-3,
50 parts of MARUKA LYNCUR PHM-C,
10 parts of the polymer A-4,
35 parts of the quinonediazido group-containing compound B-1,
0.05 part of the surfactant SF-8428,
15 parts of the polynuclear phenolic compound 1 and
a mixed solvent consisting of 179 parts EL and 179 parts EEP.

The solution was filtered through a membrane filter with pores of 3 μm diameter. Thus, the composition (2-2) was obtained in 38% solids content.

Example 1

<Formation of Laminate on Substrate Surface>

Spin Coating/Spin Coating Process

The composition (1-1) was dropped on a silicon wafer and spin coated thereon. The resultant coating was baked on a hot plate at 100° C. for 10 minutes to give a resist layer (I) (under layer). Thereafter, the composition (2-1) was dropped and spin coated on the above-formed under layer. The coating was baked on a hot plate at 100° C. for 5 minutes to give a resist layer (II) (upper layer). A two-layer laminate was thus obtained.

<Evaluation of Application Properties and Layers Thickness>

After the lower and upper layers had been formed on the substrate, the top surface of the laminate was observed with a light microscope. The surface condition was evaluated as either A or B based on the following criteria. The results are set forth in Table 3.

Application properties A: the layers were uniform overall on the substrate
B: the layers had released partially and had holes, i.e., the layers were not uniform overall on the substrate The substrate having the layers evaluated above as A (good application properties) was then subjected to a measurement of the thicknesses of lower and upper layers. The measurement was made with a stylus-type film thickness gauge. The thickness of the upper layer was obtained by subtracting the thickness of the lower layer from the thickness of the two-layer laminate. The results are set forth in Table 3.

<Exposure, Development and Evaluation of Results>

The substrate having the layers evaluated above as A (good application properties) was photoexposed and thereafter developed with an alkaline aqueous solution. This patterning process was carried out under the conditions of:
Aligner: Karl Suss Aligner MA150 (contact aligner, available from SUSS Microtec)
Dose: 500 mJ/cm$^2$ (at around 420 nm)
Exposure mode: hard contact exposure
Development: carried out by dipping the substrate in an aqueous solution of tetramethylammonium hydroxide
Developing time: changed by the 10 seconds
Rinsing: one minute rinsing under running ultra-pure water, followed by air-blow drying After the development, the pattern profile obtained was evaluated through observation with a light microscope, and also with a scanning electron microscope depending on the need. The evaluation was made with respect to the round holes which have a diameter of 20 μm and which are away from the neighboring holes at a spacing of 40 μm (60 μm pitch)

The developability was evaluated as either A or B based on the following criteria. The results are set forth in Table 3.

Developability A: no undesired portions remaining after the development, beautiful undercut profile, and no connection between neighboring undercut holes after the developing time of 20 seconds or more Developability B: undesired portions remaining after the development irrespective of the developing time, and/or undercut holes connecting with neighboring ones <Formation and Evaluation of DLC Layer>

The substrate with the resist pattern evaluated above as A (good developability) was post baked on a hot plate at 80° C. for 10 minutes. This substrate was used to form a DLC layer thereon and to evaluate the DLC layer.

The DLC layer was manufactured with use of DLC-150S (available from Shimadzu Corporation).

In the formation of the DLC layer, the substrate having the pattern was first pretreated. The pretreatment was made by cleaning their surfaces by sputtering, and depositing on the cleaned surfaces Si in an approximate thickness of 20 Å. Thereafter, a DLC layer was deposited in a thickness of 250 to 300 Å. Here, the degree of vacuum was $5\times10^{-3}$ Torr.

Thereafter, the substrate, which then had the DLC layer on the surface, was dipped in N-methylpyrrolidone at 100° C. for about 10 minutes. As a result, the resist released. The substrate was then rinsed several times with acetone and thereafter blow dried.

Evaluation of Resist Releasability

After the release of the resist layer, the revealed surface was observed with a light microscope. The surface state was evaluated based on the following criteria. The results are set forth in Table 3.

Releasability A: release treatment left no residues on the substrate surface
B: release treatment left residues on the substrate surface Evaluation of DLC Layer The thus-obtained DLC pattern was observed with an AFM (atomic force microscope) to evaluate the figuration of the pattern based on the following criteria. The results are set forth in Table 3.

AA: no burrs/protrusions found on the surface of all the DLC layers on the substrate, the pattern diameters ranging from about 20 to 21 μm A: no burrs/protrusions found on the surface of all the DLC layers on the substrate, the pattern diameters being 22 µm or more B: burrs/protrusions present on the surface of the DLC layer(s)

<Formation and Evaluation of Alumina Layer>

The substrate with the resist pattern evaluated above as A (good developability) was post baked on a hot plate at 80° C. for 10 minutes. This substrate was used to form an alumina layer thereon and to evaluate the alumina layer. The alumina layers are used as insulating layers in gaps between GMR elements.

The alumina layer was manufactured with use of MPS-GA-LTS (available from Ulvac Equipment Sales Inc.).

In the formation of the alumina layer, the substrate having the pattern was first pretreated. The pretreatment was made by cleaning their surfaces by sputtering, and depositing on the cleaned surfaces an alumina layer in a thickness of 1500 to 1600 Å. Here, the degree of vacuum was $5 \times 10^{-5}$ Torr and the substrate temperature was set at about 70° C. The rate in forming the alumina layer was about 100 Å/min.

The evaluations of the figuration of the alumina layer and the releasability of the resist layer were made exactly in the same manners as for the DLC layer. The results are set forth in Table 3.

Example 2

The procedure of Example 1 was repeated except that the composition 1 for lower layer production was changed from (1-1) to (1-2). The composition 2 for upper layer production was unchanged. These are specified in Tables 1 and 2. The results are set forth in Table 3.

Example 3

The procedure of Example 1 was repeated except that the composition 1 for lower layer production was changed from (1-1) to (1-3). The composition 2 for upper layer production was unchanged. These are specified in Tables 1 and 2. The results are set forth in Table 3.

Example 4

The procedure of Example 1 was repeated except that the composition 1 for lower layer production was changed from (1-1) to (1-4) and that the layers thickness was altered. The composition 2 for upper layer production was unchanged. These are specified in Tables 1 and 2. The results are set forth in Table 3.

Example 5

The procedure of Example 1 was repeated except that the composition 1 for lower layer production was changed from (1-1) to (1-4), that the lower layer was produced through lamination as described below, and that the layers thickness was altered. The composition 2 for upper layer production was unchanged. These are specified in Tables 1 and 2. The results are set forth in Table 3.

Laminating/Spin Coating Process

The composition (1-4) was dropped on a PET film and spin coated thereon. The resultant coating was baked in an oven at 100° C. for 5 minutes to give a film. Thereafter, the film was laminated on a silicon wafer and the PET film was released from the laminate. Thus, a resist layer (I) (under layer) was formed on the substrate. The laminating conditions were as follows:

Conveying speed: 0.1 m/min

Roll temperature: 95° C.

Rolling pressure: 1.5 kgf/cm$^2$

Thereafter, the composition (2-1) was dropped and spin coated on the above-formed under layer. The coating was baked on a hot plate at 100° C. for 5 minutes to give a resist layer (II) (upper layer). A two-layer laminate was thus obtained.

Example 6

The procedure of Example 4 was repeated except that the composition 2 for upper layer production was changed from (2-1) to (2-2). The composition 1 for lower layer production was unchanged. These are specified in Tables 1 and 2. The results are set forth in Table 3.

Example 7

The procedure of Example 5 was repeated except that the composition 2 for upper layer production was changed from (2-1) to (2-2). The composition 1 for lower layer production was unchanged. These are specified in Tables 1 and 2. The results are set forth in Table 3.

Example 8

The procedure of Example 5 was repeated except that the composition 1 for lower layer production was changed from (1-4) to (1-5) and that the composition 2 for upper layer production was changed from (2-1) to (2-2). These are specified in Tables 1 and 2. The results are set forth in Table 3.

Example 9

The procedure of Example 5 was repeated except that the composition 1 for lower layer production was changed from (1-4) to (1-6) and that the composition 2 for upper layer production was changed from (2-1) to (2-2). These are specified in Tables 1 and 2. The results are set forth in Table 3.

Comparative Example 1

The procedure of Example 4 was repeated except that the composition 1 for lower layer production was changed from (1-4) to (1-7). The composition 2 for upper layer production was unchanged. These are specified in Tables 1 and 2. The results are set forth in Table 3.

Comparative Example 2

The procedure of Example 5 was repeated except that the composition 1 for lower layer production was changed from (1-4) to (1-7). The composition 2 for upper layer production was unchanged. These are specified in Tables 1 and 2. The results are set forth in Table 3.

Comparative Example 3

The procedure of Example 6 was repeated except that the composition 1 for lower layer production was changed from (1-4) to (1-7). The composition 2 for upper layer production was unchanged. These are specified in Tables 1 and 2. The results are set forth in Table 3.

Comparative Example 4

The procedure of Example 7 was repeated except that the composition 1 for lower layer production was changed from (1-4) to (1-7). The composition 2 for upper layer production was unchanged. These are specified in Tables 1 and 2. The results are set forth in Table 3.

TABLE 1

| | Composition 1 (lower layer) | | | |
|---|---|---|---|---|
| Sample No. | Radical polymer (A) | Quinonediazido group-containing compound (B) | Solvent (C) | surfactant (G) |
| 1-1 | A-1/ 100 parts | B-1/20 parts | EL/ 680 parts | NBX-15/ 0.2 part |
| 1-2 | A-2/ 100 parts | B-1/20 parts | EL/ 680 parts | NBX-15/ 0.2 part |
| 1-3 | A-3/ 100 parts | B-1/20 parts | EL/ 680 parts | NBX-15/ 0.2 part |
| 1-4 | A-4/ 100 parts | B-1/20 parts | EL/ 480 parts | NBX-15/ 0.2 part |
| 1-5 | A-5/ 100 parts | B-1/20 parts | EL/ 480 parts | NBX-15/ 0.2 part |
| 1-6 | A-6/ 100 parts | B-1/20 parts | EL/ 480 parts | NBX-15/ 0.2 part |
| 1-7 | A-4/ 100 parts | None | EL/ 400 parts | NBX-15/ 0.2 part |

TABLE 2

| | Composition 2 (upper layer) | | | | |
|---|---|---|---|---|---|
| Sample No. | Polymer containing a phenolic hydroxyl group (D) | Quinonediazido group-containing compound (E) | Solvent (F) | Surfactant (H) | Another additive (H) |
| 2-1 | D-1/ 90 parts | E-1/20 parts E-2/10 parts | MAK/ 180 parts | NBX-15/ 0.2 part | Polynuclear phenolic compound 1/ 10 parts |
| 2-2 | D-2/ 25 parts D-3/ 75 parts MARUKA LYNCUR PHM-C/ 50 parts | B-1/35 parts | EL/ 179 parts EEP/ 179 parts | SF-8428/ 0.05 part | Polynuclear phenolic compound 1/ 15 parts A-4/10 parts |

TABLE 3

| | Composition 1 (lower layer) | Composition 2 (upper layer) | Application (lower layer/upper layer)* | Application properties | Thickness (µm) (lower layer/upper layer) | Developability | DLC layer Releasability | DLC layer Figuration | Alumina layer Releasability | Alumina layer Figuration |
|---|---|---|---|---|---|---|---|---|---|---|
| Ex. 1 | (1-1) | (2-1) | S/S | A | 0.7/3 | A | A | AA | A | AA |
| Ex. 2 | (1-2) | (2-1) | S/S | A | 0.7/3 | A | A | AA | A | AA |
| Ex. 3 | (1-3) | (2-1) | S/S | A | 0.7/3 | A | A | AA | A | AA |
| Ex. 4 | (1-4) | (2-1) | S/S | A | 2/4 | A | A | A | A | AA |
| Ex. 5 | (1-4) | (2-1) | L/S | A | 2/4 | A | A | A | A | AA |
| Ex. 6 | (1-4) | (2-2) | S/S | A | 2/4 | A | A | A | A | AA |
| Ex. 7 | (1-4) | (2-2) | L/S | A | 2/4 | A | A | A | A | AA |
| Ex. 8 | (1-5) | (2-2) | L/S | A | 2/4 | A | A | A | A | AA |
| Ex. 9 | (1-6) | (2-2) | L/S | A | 2/4 | A | A | A | A | AA |
| Comp. Ex. 1 | (1-7) | (2-1) | S/S | A | 2/4 | B | — | — | — | — |
| Comp. Ex. 2 | (1-7) | (2-1) | L/S | A | 2/4 | B | — | — | — | — |
| Comp. Ex. 3 | (1-7) | (2-2) | S/S | A | 2/4 | B | — | — | — | — |
| Comp. Ex. 4 | (1-7) | (2-2) | L/S | A | 2/4 | B | — | — | — | — |

*S: Spin coating, L: Laminating

FIELD OF INDUSTRIAL APPLICATION

As described above, the two-layer laminate and the patterning method of the invention make it possible to form on a substrate a fine resist pattern having an undercut cross section by single exposure and development. The lift-off process using the resist pattern can produce desired a pattern of (organic or inorganic) thin layers on the substrate without any occurrence of burrs. The resist pattern can be observed with a light microscope to confirm the undercut profile, and can be released easily. With these advantages in the production process, the use of the invention leads to enhancement in productivity of workpieces.

Having the above effects, the two-layer laminate and the patterning method of the invention are particularly suitable for the production of DLC (diamond like carbon) layers on ABS (air bearing surfaces) of magnetic heads.

The invention claimed is:

1. A two-layer laminate comprising:
    a resist layer (I) formed from a positive radiation-sensitive resin composition 1 which comprises a radical polymer containing a hydroxyl group and a carboxyl group (A), a quinonediazido group-containing compound (B) and a solvent (C); and
    a resist layer (II) formed on the resist layer (I) from a positive radiation-sensitive resin composition 2 which comprises a polymer containing a phenolic hydroxyl group (D), a quinonediazido group-containing compound (E) and a solvent (F);
    wherein the positive radiation-sensitive resin composition 1 comprises the quinonediazido group-containing compound (B) in an amount of 10 to 50 parts by weight based on 100 parts by weight of the radical polymer (A).

2. The two-layer laminate according to claim 1, wherein in the positive radiation-sensitive resin composition 1, the radical polymer (A) is insoluble in water, soluble in an alkaline aqueous solution and insoluble or hardly soluble in the solvent (F).

3. The two-layer laminate according to claim 1, wherein in the positive radiation-sensitive resin composition 2, the solvent (F) is 2-heptanone.

4. The two-layer laminate according to claim 1, wherein the resist layer (I) has a thickness of 0.1 to 3 µm and the resist layer (II) has a thickness of 1 to 20 µm.

5. The two-layer laminate according to claim 1, wherein in the positive radiation-sensitive resin composition 1, the radical polymer (A) is obtained by the radical polymerization of a radically polymerizable compound having a hydroxyl group (monomer I), a radically polymerizable compound having a carboxyl group (monomer II), and another radically polymerizable compound (monomer III).

6. The two-layer laminate according to claim 5, wherein the monomer I is at least one monomer selected from a monomer with an alcoholic hydroxyl group and a monomer with a phenolic hydroxyl group.

7. The two-layer laminate according to claim 6, wherein the monomer with an alcoholic hydroxyl group is at least one compound selected from a hydroxyalkyl ester and vinyl ester of fatty acid that will produce an alcoholic hydroxyl group upon hydrolysis after polymerization.

8. The two-layer laminate according to claim 6, wherein the monomer with an alcoholic hydroxyl group is a hydroxyalkyl ester, and the monomer with a phenolic hydroxyl group is at least one compound selected from p-hydroxystyrene, m-hydroxystyrene, o-hydroxystyrene, α-methyl-p-hydroxystyrene, α-methyl-m-hydroxystyrene, α-methyl-o-hydroxystyrene, 4-isopropenylphenol, 2-allylphenol, 4-allylphenol, 2-allyl-6-methylphenol, 2-allyl-6-methoxyphenol, 4-allyl-2-methoxyphenol, 4-allyl-2,6-dimethoxyphenol and 4-allyloxy-2-hydroxybenzophenone.

9. The two-layer laminate according to claim 6, wherein the monomer with an alcoholic hydroxyl group is at least one compound selected from 2-hydroxyethyl methacrylate and 2-hydroxyethyl acrylate, and
    the monomer with a phenolic hydroxyl group is at least one compound selected from p-hydroxystyrene and 4-isopropenylphenol.

10. The two-layer laminate according to claim 5, wherein the monomer II is at least one compound selected from monocarboxylic acid, dicarboxylic acid and (meth)acrylic acid derivative with a carboxyl group.

11. The two-layer laminate according to claim 5, wherein the monomer II is at least one compound selected from acrylic acid, methacrylic acid and 2-hexahydropathaloyl-ethyl methacrylate.

12. The two-layer laminate according to claim 5, wherein the monomer III is alkyl acrylate.

13. The two-layer laminate according to claim 12, wherein alkyl acrylate is n-butyl acrylate.

14. The two-layer laminate according to claim 5, wherein the monomer I is at least one monomer selected from 2-hydroxyethyl methacrylate, 2-hydroxyethyl acrylate, p-hydroxystyrene and 4-isopropenylphenol, and
    the monomer II is at least one compound selected from acrylic acid, methacrylic acid and 2-hexahydrophthaloylethyl methacrylate, and
    the monomer III is n-butyl acrylate.

15. A patterning method comprising a step of forming a two-layer laminate comprising:
    a resist layer (I) formed from a positive radiation-sensitive resin composition 1 which comprises a radical polymer containing a hydroxyl group and a carboxyl group (A), a quinonediazido group-containing compound (B) and a solvent (C); and
    a resist layer (II) formed on the resist layer (I) from a positive radiation-sensitive resin composition 2 which comprises a polymer containing a phenolic hydroxyl group (D), a quinonediazido group-containing compound (E) and a solvent (F);
    wherein the positive radiation-sensitive resin composition 1 comprises the quinonediazido group-containing compound (B) in an amount of 10 to 50 parts by weight based on 100 parts by weight of the radical polymer (A).

16. The patterning method according to claim 15, comprising the steps of:
    (a) forming on a substrate a resist layer (I) from the positive radiation-sensitive resin composition 1 and forming on the resist layer (I) a resist layer (II) from the positive radiation-sensitive resin composition 2 to produce a two-layer laminate;
    (b) forming a latent pattern in the laminate by UV light exposure and/or electron beam lithography;
    (c) developing the laminate to form an undercut resist pattern haven orifices in which the orifices have a larger size in the bottom than in the top;
    (d) depositing and/or sputtering an organic or inorganic thin layer on the resist pattern laminate and on the exposed substrate; and
    (e) releasing the laminate together with the overlying thin layer deposited and/or sputtered on the laminate.

17. The patterning method according to claim 16, wherein the substrate in the step (a) is an ABS (air bearing surface)

of a magnetic head slider and the organic thin layer in the step (d) is a DLC (diamond like carbon) layer.

18. The patterning method according to claim 15, wherein in the positive radiation-sensitive resin composition 1, the radical polymer (A) is insoluble in water, soluble in an alkaline aqueous solution and insoluble or hardly soluble in the solvent (F).

19. The patterning method according to claim 15, wherein in the positive radiation-sensitive resin composition 2, the solvent (F) is 2-heptanone.

20. The patterning method according to claim 15, wherein the resist layer (I) has a thickness of 0.1 to 3 μm and the resist layer (II) has a thickness of 1to 20 μm.

21. The patterning method according to claim 15, wherein the positive radiation-sensitive resin composition 1, the radical polymer (A) is obtained by the radical polymerization of a radically polymerizable compound having a hydroxyl group (monomer I), a radically polymerizable compound having a carboxyl group (monomer II), and another radically polymerizable compound (monomer III).

22. The patterning method according to claim 21, wherein the monomer I is at least one monomer selected from a monomer with an alcoholic hydroxyl group and a monomer with a phenolic hydroxyl group.

23. The patterning method according to claim 22, wherein the monomer with an alcoholic hydroxyl group is at least one compound selected from a hydroxyalkyl ester and vinyl ester of fatty acid that will produce an alcoholic hydroxyl group upon hydrolysis after polymerization.

24. The patterning method according to claim 22, wherein the monomer with an alcoholic hydroxyl group is a hydroxyalkyl ester, and the monomer with a phenolic hydroxyl group is at least one compound selected from p-hydroxystyrene, m-hydroxystyrene, o-hydroxystyrene, α-methyl-p-hydroxystyrene, α-methyl-m-hydroxystyrene, α-methyl-o-hydroxystyrene, 4-isopropenylphenol, 2-allylphenol, 4-allylphenol, 2-allyl-6-methylphenol, 2-allyl-6-methoxyphenol, 4-allyl-2-methoxyphenol, 4-allyl-2,6-dimethoxyphenol and 4-allyloxy-2-hydroxybenzophenone.

25. The patterning method according to claim 22, wherein the monomer with an alcoholic hydroxyl group is at least one compound selected from 2-hydroxyethyl methacrylate and 2-hydroxyethyl acrylate, and the monomer with a phenolic hydroxyl group is at least one compound selected from p-hydroxystyrene and 4-isopropenylphenol.

26. The patterning method according to claim 21, wherein the monomer II is at least one compound selected from monocarboxylic acid, dicarboxylic acid and (meth)acrylic acid derivative with a carboxyl group.

27. The patterning method according to claim 21, wherein the monomer II is at least one compound selected from acrylic acid, methacrylic acid and 2-hexahydrophthaloylethyl methacrylate.

28. The patterning method according to claim 21, wherein the monomer III is alkyl acrylate.

29. The patterning method according to claim 28, wherein the alkyl acrylate is n-butyl acrylate.

30. The patterning method according to claim 21, wherein the monomer I is at least one compound selected from 2-hydroxyethyl methacrylate, 2-hydroxyethyl acrylate, p-hydroxystyrene and 4-isopropenylphenol, and the monomer II is at least one compound selected from acrylic acid, methacrylic acid and 2-hexahydrophthaloylethyl methacrylate, and the monomer III is n-butyl acrylate.

* * * * *